United States Patent
Patapoutian et al.

[11] Patent Number: 5,825,318
[45] Date of Patent: Oct. 20, 1998

[54] DATA AND SERVO SAMPLING IN SYNCHRONOUS DATA DETECTION CHANNEL

[75] Inventors: Ara Patapoutian, Westboro, Calif.; Kevin D. Fisher, Palo Alto, Calif.; Bruce D. Buch, Westboro, Mass.

[73] Assignee: Quantum Corporation, Milpitas, Calif.

[21] Appl. No.: 769,823

[22] Filed: Dec. 19, 1996

[51] Int. Cl.⁶ ............................................ H03M 1/20
[52] U.S. Cl. ................................ 341/131; 341/155
[58] Field of Search ........................... 341/131, 118, 341/120, 143, 155

[56] References Cited

U.S. PATENT DOCUMENTS

| | | | |
|---|---|---|---|
| 4,890,299 | 12/1989 | Dolivo et al. | 375/18 |
| 5,451,947 | 9/1995 | Morrison | 341/131 |
| 5,459,679 | 10/1995 | Ziperovich | 364/602 |
| 5,493,298 | 2/1996 | Bartz | 341/131 |
| 5,525,984 | 6/1996 | Bunker | 341/131 |
| 5,552,942 | 9/1996 | Ziperovich et al. | 360/51 |
| 5,576,906 | 11/1996 | Fisher et al. | 360/77.08 |

*Primary Examiner*—Howard L. Williams
*Assistant Examiner*—Peguy Jean Pierre
*Attorney, Agent, or Firm*—David B. Harrison; Debra A. Chun; Robert V. Klauzinski

[57] ABSTRACT

An analog-to-digital converter circuit in a sampling data detection channel of a disk drive synchronously samples user data in the data track areas at a first quantization resolution and samples servo bursts from the spoke areas at a second quantization resolution effectively greater than said first quantization resolution. An offset circuit provides a predetermined analog offset signal to a combining circuit which combines it with an incoming analog signal to provide a composite signal during a spoke servo burst sampling interval. An analog-to-digital converter samples the composite signal during the servo spoke burst sampling interval, and synchronously samples the analog signal during a user data sampling interval. A digital averaging circuit averages the servo spoke samples over a predetermined averaging interval to provide averaged burst samples having increased bit resolution.

31 Claims, 7 Drawing Sheets

DATA AND SERVO SAMPLING IN SYNCHRONOUS DATA DETECTION CHANNEL

FIELD OF THE INVENTION

The present invention relates to apparatus and methods for sampling an analog signal including user data and embedded head position information within a magnetic data storage device. More particularly, the present invention provides an analog-to-digital converter with increased resolution during servo fine position sampling.

BACKGROUND OF THE INVENTION

Magnetic data storage devices, such as disk drives and tape drives, are called upon to hold an ever-increasing amount of user information per unit storage area of the storage medium. Some portion of the increase has come about by increasing the flux transition density within each data track. Another portion of the increase has been to make the data tracks narrower, and to record the information tracks closer together on the storage medium.

In the case of magnetic disk drives, increased flux transition densities have caused flux transition peaks to overlap. This overlap is known as "inter-symbol interference" or "ISI". Unless accounted for in read channel designs, ISI can result in data bit errors.

One known method for reducing ISI-induced data bit errors is to employ a signaling technique known as "partial response, maximum likelihood detection" or "PRML". Unlike analog peak detection techniques previously used for detecting digital information, PRML handles a predetermined amount of ISI by signal shaping, synchronous sampling and by use of a digital path memory array detector implementing e.g. the Viterbi algorithm. With this detection technique, digital samples are obtained from the playback signal by being passed through the digital path memory array detector. Based on predetermined transition density and zero run length coding constraints imposed during the data writing operation, and on extensive filtering and shaping of synchronous digital samples, the path memory detector determines a most likely data value. This determination is based on sample sequences including the sample or samples of interest at the most-likely data-decision time. The data-decision time is reached after the sample has traversed various possible states of the path memory detector and has survived as a most likely correct data value. Thus, the process of deciding upon the most likely data value does not occur immediately following reading of the analog data from the magnetic disk as was the case with the prior peak-detection technique. Rather, the data decision occurs at the end of a process sequence following a number of detection process steps.

The required bit resolution of each sample provided by an analog-to-digital converter within a digital detector of the read channel can be determined by the robustness of the channel in relation to noise and other factors. The presence of powerful error correction code processes also serves to enhance accuracy of data reproduction. Presently, a high speed analog-to-digital converter having six-bit resolution has generally proven adequate for synchronous sample quantization of user data at the predetermined channel data rate. PRML synchronous data detection channels frequently employ six-bit flash analog-to-digital converters for providing synchronous samples of the analog signal read from the storage medium. One example of a PRML synchronous data detection channel is found in commonly assigned U.S. Pat. No. 5,341,249, entitled: "Disk Drive Using PRML Class IV Sampling Data Detection with Digital Adaptive Equalization", the disclosure thereof being incorporated herein by reference.

While accurate user data retrieval from a PRML-based magnetic data storage device is a principal design consideration, another consideration is accurate head positioning. The read/write data transducer head must be accurately positioned over the data track, so that the desired information is passed into the detection channel. As tracks become narrower and are written closer together, accurate head positioning during track following operations becomes more challenging and more important within the disk drive.

Read transducers, particularly inductive transducers, are well suited for service as position detectors, as flux magnitude of a servo burst is roughly proportional to the portion of the magnetic gap passing over the recorded burst. Magneto-resistive ("MR") read elements tend to have output signals which are far less proportional to burst amplitude than inductive read elements, and head calibration routines are frequently employed when MR heads are used within embedded sector head position servo loops.

A head positioning servo loop is used to control e.g. a rotary voice coil motor of an actuator for rapidly repositioning the head from track to track during track seeking operations, and for accurately positioning and maintaining the head at the desired track location during track following operations. In the case of magnetic disk drives, head positioning information is typically provided in servo sectors interspersed among data tracks at regular circumferential intervals around the disk surface. In one preferred example, commonly assigned U.S. patent application Ser. No. 08/724,977 filed on Oct. 3, 1996 and entitled: "Disk Drive Digital Servo Information, Detection and Estimation", the disclosure thereof being incorporated herein by reference, a wide-biphase servo arrangement was described in which the servo information is recorded at a rate lower than the data transfer rate, but in a format compatible for detection within the synchronous sampling data detection channel. In this example, the servo information is recorded at a constant data rate across the radius of the disk, the rate being associated with a user data rate at the inside diameter storage area of the disk. On the other hand, the user data is recorded, e.g. in radial bands or zones wherein each zone has a data rate adjusted to disk radius. The outer radius zone has a highest data rate, typically twice the data rate of the radially innermost data zone. The channel analog-to-digital converter must have a speed capable of providing synchronous digital samples at the highest data rate.

Frequently, although not necessarily, the servo fine position information is provided within each servo spoke as a series of fields of circumferentially sequential, radially offset constant frequency bursts. The burst waves are induced into the head, amplified and peak detected. Each wave peak may be sampled and quantized, or, frequently, the peak is stored on an integrating capacitor and a resultant average peak value is quantized and used by the servo control loop. Phase-coherent, concurrent servo bursts may also be used for head fine position control. One example of this alternative is provided in co-inventor Fisher's commonly assigned U.S. Pat. No. 5,576,906, entitled: "Synchronous Detection of Concurrent Servo Bursts for Fine Head Position in Disk Drive", the disclosure thereof being incorporated herein by reference.

Ideally, the same data head that will be reading the user data also reads the servo information recorded for the track being followed by the head positioning servo. In this way there should be little to no offset between the servo position information and the user data information, both being recorded as patterns of magnetic flux transitions. However, unlike the data channel which preferably has a certain process latency to provide maximum-likelihood data detection, the servo loop needs to obtain and to provide a head correction based upon the sensed head position as soon as possible, without waiting for a full revolution of the disk. The requirement for accurate head position information is more stringent than is required for user data samples, in at least the sense that the information must be processed immediately following availability, and in the sense that error correction code, and memory path detection techniques (which typically require a number of processing steps) are not usually used to protect the accuracy of the servo fine head position information.

In peak detection channels of the prior art, it was usual practice to include a separate analog servo peak detection circuit, followed by a servo analog-to-digital converter for providing fine position error information to the head positioner servo loop. With the prior approach, exemplified for example in commonly assigned U.S. Pat. No. 5,255,136, entitled: "High Capacity Submicro-Winchester Fixed Disk Drive", the disclosure thereof being incorporated herein by reference, the analog-to-digital converter was provided with sufficient resolution and speed to supply accurate and timely head fine position error information to the head position digital servo process.

However, since a synchronous data detection channel, such as PRML, already has at least one high speed analog-to-digital converter within the read channel, it would be desirable to use the same converter for both user data and servo position estimation, thereby eliminating additional and/or complex hardware which would add to storage device cost. Conventionally, the channel analog-to-digital converter has six bits conversion resolution which is satisfactory for data signal quantization within the PRML synchronous sampling data detection scheme. However, six bit resolution may prove marginal for servo fine position information quantization (i.e. servo burst demodulation), and a higher level of quantization, such as e.g. eight bits, would provide a more accurate head fine position error signal.

Some level of noise is present within the data detection channel. This noise is typically Gaussian or white noise. The noise is experienced at quantization and in a sense provides a form of dithering such that the noise may cause the read back signal, in this case the servo position error signal at the moment of sampling and digital conversion, to vary while the actual noiseless servo signal remains constant, for example. Digitally, when an entire servo burst is demodulated, a number of amplitude samples are obtained, and each sample carries some amount of quantization noise. These noisy samples are passed through a correlation filter and averaged by an integration function to provide an absolute average value. Since each sample will have different noise, a dithering effect is thus created with some potential cancellation of the noise. However, the noise modulation may not have sufficient amplitude to cause the analog-to-digital converter to use different comparators in quantizing the servo signal burst, and differential non-linearity may introduce further error into the servo amplitude average value.

FIG. 1 illustrates "differential non-linearity". To begin with, an analog-to digital conversion process theoretically has an infinite conversion accuracy, and the digital output would have sufficient precision to exactly correlate to the signal's analog amplitude at the sampling moment. Infinite linearity is shown by the line graph L of FIG. 1, which varies linearly as a function of sample amplitude. In practice, analog-to-digital converters are not infinitely accurate. Most commonly, analog-to-digital converters are composed of an array of voltage comparators having commonly connected differential inputs, and having stepped reference level inputs derived from a voltage divider network. This results in a stair-step granularity pattern SS which is superimposed on the line graph L in FIG. 1. The left-most levels represent nominal stair-step increments in an ideal granular analog-to-digital converter. In practice, however, the step intervals are not equal. Each voltage comparator within the analog-to-digital converter must be considered to be an independent random variable. The uneven stair-step levels are known as "differential non-linearity" and are shown as the second vertical column of levels in the FIG. 1 graph.

While differential non-linearity is a problem with all analog-to-digital converters, it has become increasingly exacerbated by the present trends in making integrated circuit processes more dense, and by reducing supply voltage potentials to e.g. 3.3 volts, or less. These constraints have tended to amplify the differential non-linearity problem confronted by the designer. When channel noise is added to the differential non-linearity quantization problems shown in e.g. FIG. 1, the result may be a less-than-accurate, less-than-satisfactory servo burst demodulation process when the read channel electronics are used.

It is known to provide a high speed analog-to-digital converter formed of two conversion circuits, such as ADC1 and ADC2 shown in FIG. 2, which alternatively quantize even and odd samples at a quantization rate which is e.g. one half of an effective data rate of the information carried in the analog signal. While this approach is generally satisfactory, the resultant samples are limited in resolution to the resolution of each conversion circuit. In the FIG. 2 example ADC1 and ADC 2 are 6 bit analog-to-digital converters. An example of sampling of data by the FIG. 2 dual ADC approach is presented in the FIG. 2A graph. While ADC1 and ADC 2 may be necessary to quantize the highest channel rate user data (outer radial data zone data), the servo information may be at a much slower data rate, such as onehalf the highest channel rate user data. This half-data-rate for servo quantization suggests that only one analog-to-digital converter is needed for servo quantization, and the other analog-to-digital converter is available for other useful work.

A hitherto unsolved need has arisen for a synchronous data detection channel analog-to-digital converter and conversion method which can be adapted to provide higher resolution for fine head position servo sampling during disk drive operations in which the head is settling toward, or following, a particular circular data track locus on the disk storage surface.

SUMMARY OF THE INVENTION WITH OBJECTS

One object of the present invention is to provide a single analog-to-digital converter for servo as well as user data synchronous sampling within a hard disk drive in a manner which increases output resolution for the servo information, in a manner overcoming limitations and drawbacks of the prior art.

Another object of the present invention is to inject a predetermined offset signal into an analog servo signal stream in order to increase quantization accuracy of a bit-resolution-limited high speed analog-to-digital converter employed within a synchronously sampled data detection channel during a servo position error quantization interval.

A further object of the present invention is to inject a controlled offset signal into an analog servo signal stream prior to synchronous digital demodulation and to average synchronous digital samples over an averaging interval in order to increase servo burst quantization accuracy.

An improved analog-to-digital converter circuit is provided for a sampling data detection channel of a disk drive. The disk drive includes a rotating disk having data track areas divided by spoke areas containing header and servo head position information. The improved analog-to-digital converter circuit synchronously samples user data in the data track areas at a first quantization resolution and synchronously samples servo data from the spoke areas at a second quantization resolution effectively greater than said first quantization resolution. The converter circuit comprises an input for receiving an analog signal to be quantized from analog circuitry of the disk drive; an offset signal producing circuit for providing a predetermined analog offset signal; a combining circuit for combining the analog signal with the offset signal to provide a composite signal during a spoke servo sampling interval; an analog-to-digital conversion circuit for synchronously sampling the composite signal during the servo spoke sampling interval, and for synchronously sampling the analog signal during a user data sampling interval, for producing sequences of spoke servo samples and user data samples; and, a digital averaging circuit connected to average the servo spoke samples over a predetermined averaging interval to provide servo spoke average samples having increased quantization resolution.

In one preferred embodiment, an ADC having features of the present invention includes first and second analog summing circuits for receiving an analog signal from a source. The first analog summing circuit adds a first predetermined offset value to the analog input signal to provide a first analog sum and the second analog summing circuit adds a second predetermined offset value to the analog input signal to provide a second analog sum. Additionally, first and second ADCs are each individually connected to the first and the second analog summing circuits respectively. Thus, the first ADC receives the first analog sum from the first analog summing circuit and the second ADC receives the second analog sum from the second analog summing circuit. Both the first and the second ADCs are commonly connected to an analog front end circuit. The analog front end circuitry essentially provides a plurality of analog reference signals to the ADCs. The ADC further includes a digital summing and averaging circuit, such as an "n" bit adder, for calculating the sum and average of the first and second digitized samples provided by the first and second ADCs for providing an improved resolution digitized output with minimal quantization errors. Preferably, the ADCs are synchronized to a common clock and thus have a common sampling rate, thereby providing an output with a higher resolution digitized sample, e.g., an "n+1" bit digitized samples.

These and other objects, advantages, aspects and features of the present invention will be more fully understood and appreciated upon consideration of the following detailed description of a preferred embodiment, presented in conjunction with the accompanying drawings.

DETAILED DESCRIPTION OF A PREFERRED EMBODIMENT

Figure 3:
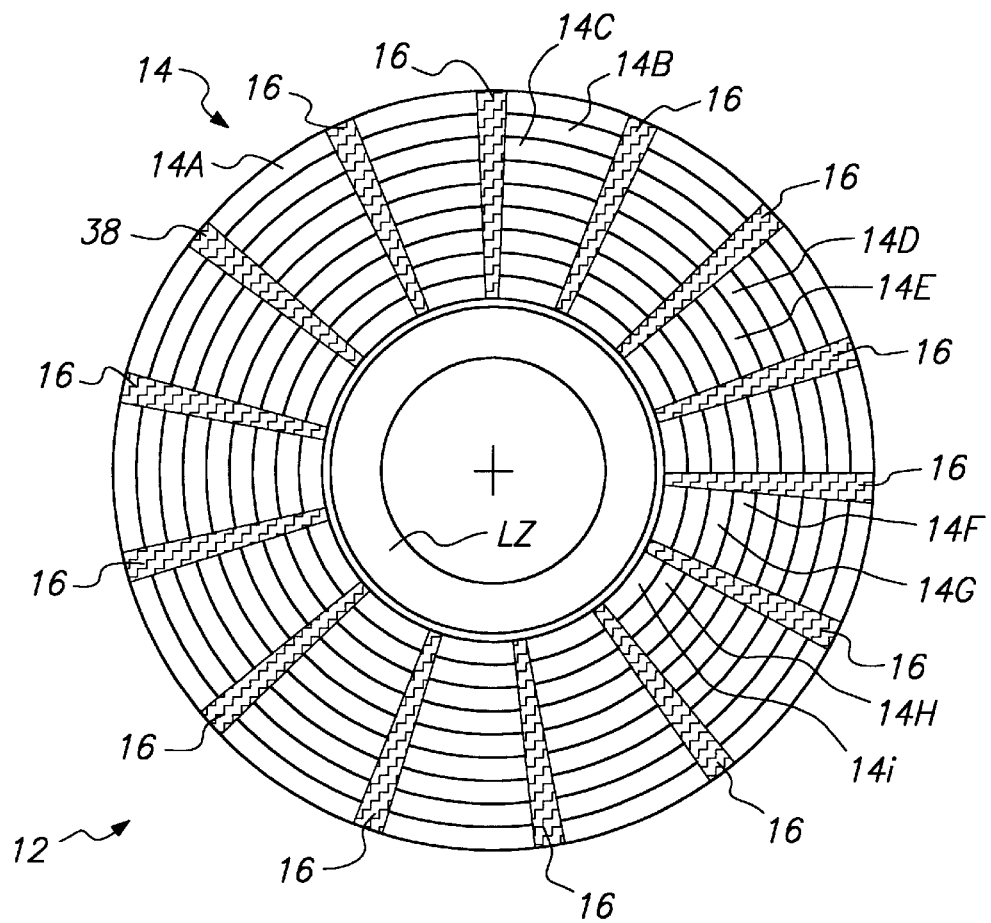
FIG. 3 is a diagrammatic plan view of a disk format layout for a storage surface of a disk drive, showing constant data rate servo spokes embedded within zoned user data recording areas.

FIG. 3 illustrates a data format for a storage disk 12. The disk 12 is preferably, although not necessarily, a magnetic hard disk, but it could represent an optical or magneto-optical disk. The disk includes a series of user data storage areas 14. The data storage 14 are arranged as a series of radial bands or zones, respectively labeled from outer zone to inner zone as 14A, 14B, 14C, 14D, 14E, 14F, 14G, 14H and 14i. In the present example, the disk 12 is rotated at a constant velocity, and relative velocity between the disk 12 and a magnetic head 40 increases as the head moves from an innermost landing zone LZ to the outermost data recording zone 14A. Thus, the data transfer rate may be adjusted upwardly in relation to relative velocity between the disk 12 and the head 40. The effective data transfer rate at the outer zone 14A is approximately twice the data transfer rate at the inner zone 14i. The landing zone LZ is conventionally provided for contact start-stop recording, which is frequently used in Winchester hard disk drives in which the head is formed on an air-bearing slider which glides very closely over the disk on an air bearing effect.

The data storage areas 14 are interrupted by a series of spaced apart, narrow radial servo spokes 16. In the present example each servo spoke 16 is recorded at a data rate roughly one half of a data rate at an innermost radial data zone 14i of the user data storage areas 14. The servo spoke may typically include synchronization information, track number and sector information, error detection overhead information, and a series of spaced apart, radially offset servo bursts, shown in FIG. 4 as 16A, 16B, 16C and 16D. The bursts are typically recorded as sine waves at a predetermined burst frequency. The relative placement and number of servo bursts per data track are selected in relation to an effective head width of the read element of head 40 (which most frequently is a magneto-resistive element), and a skew angle between a write element and the read element across the radial stroke of e.g. a rotary head positioner structure 18 (coarsely diagrammed in FIG. 6).

Figure 4:
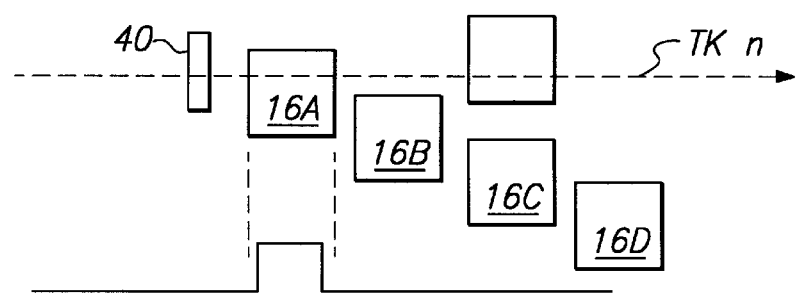
FIG. 4 is an enlarged, diagrammatic view of a head traversing a servo burst pattern recorded in one of the servo spokes of the FIG. 3 format.
Figure 6:
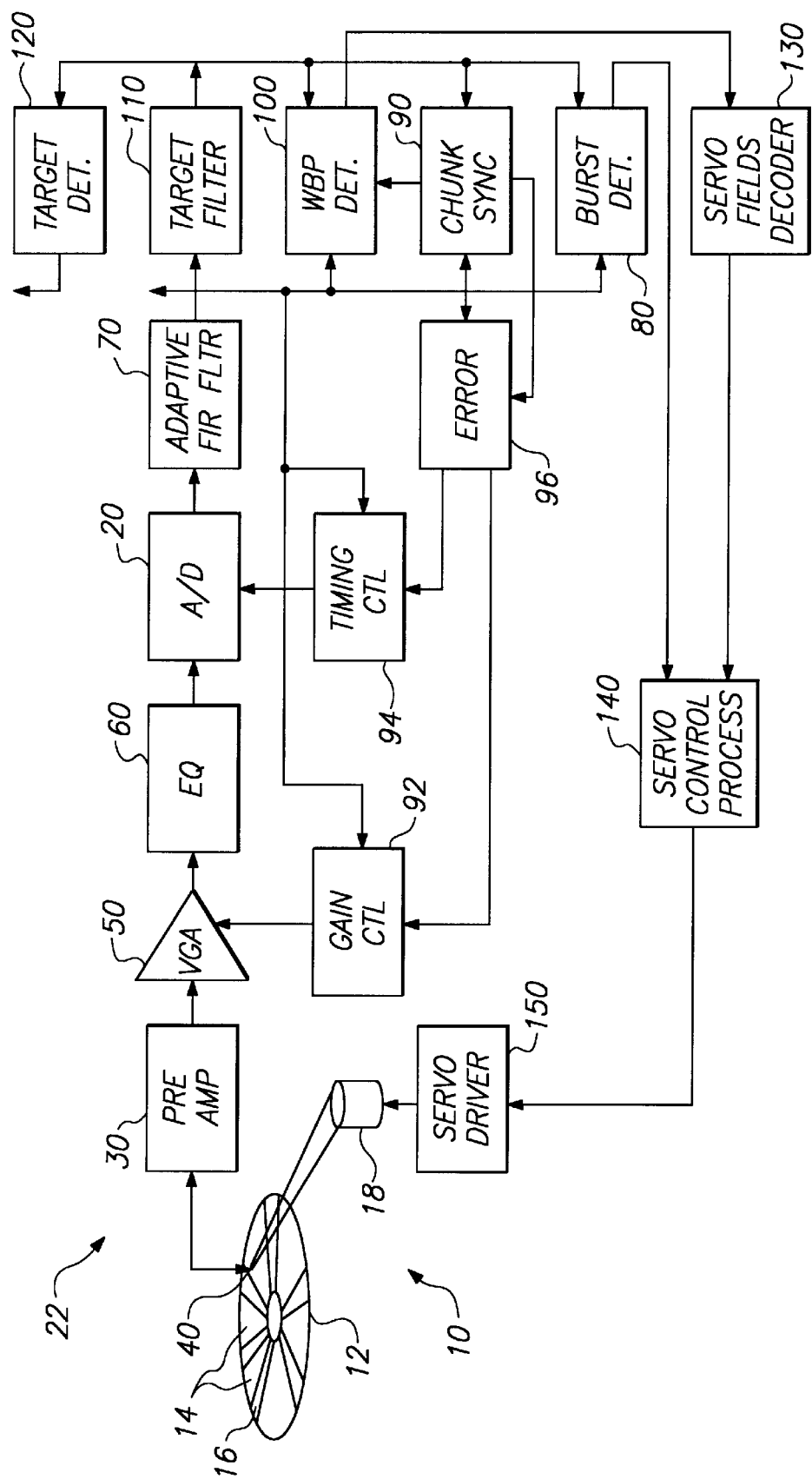
FIG. 6 is a block diagram of a disk drive having a synchronous sampling data detection channel with servo demodulation in accordance with principles of the present invention.

FIG. 4 shows the head 40 traversing across a track TKn and about to encounter a first servo burst 16A. The present invention is concerned with sequentially generating and averaging synchronous samples representing absolute relative amplitude of e.g. two servo bursts of interest, in order to develop a fine position error value for processing by a head positioner servo loop including a servo control process 140 (FIG. 6). Since each servo burst 16A, 16B, 16C, 16D is separated by an erase gap, intersymbol interference effects are present at burst boundary regions. Accordingly, FIG. 4 also graphs an underlapping sampling interval window which enables synchronous sampling and quantization of servo samples corresponding to burst 16A from an interval excluding boundary regions adjacent to the erase gaps on each side of the burst.

Figure 5:
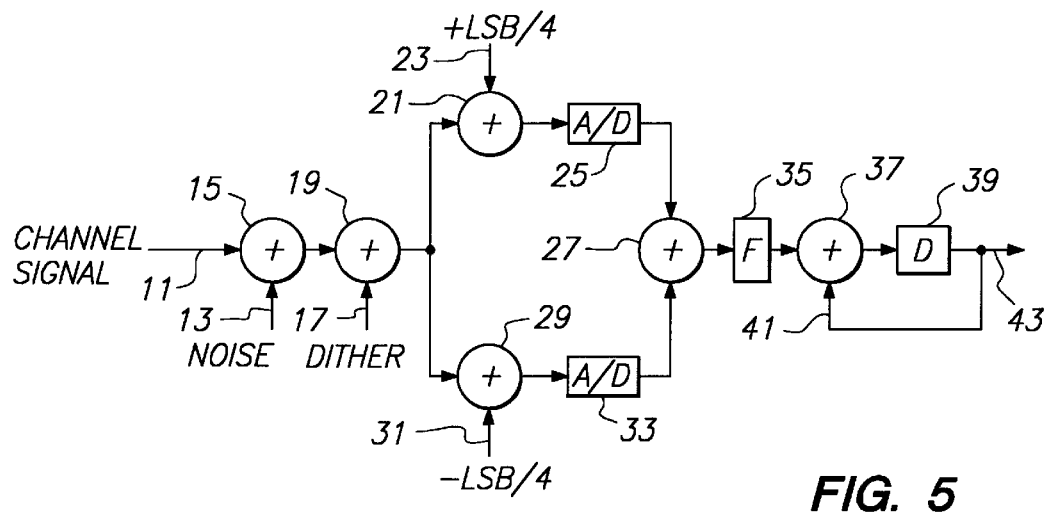
FIG. 5 is a simplified model of a servo burst demodulation channel in accordance with principles of the present invention.
Figure 7:
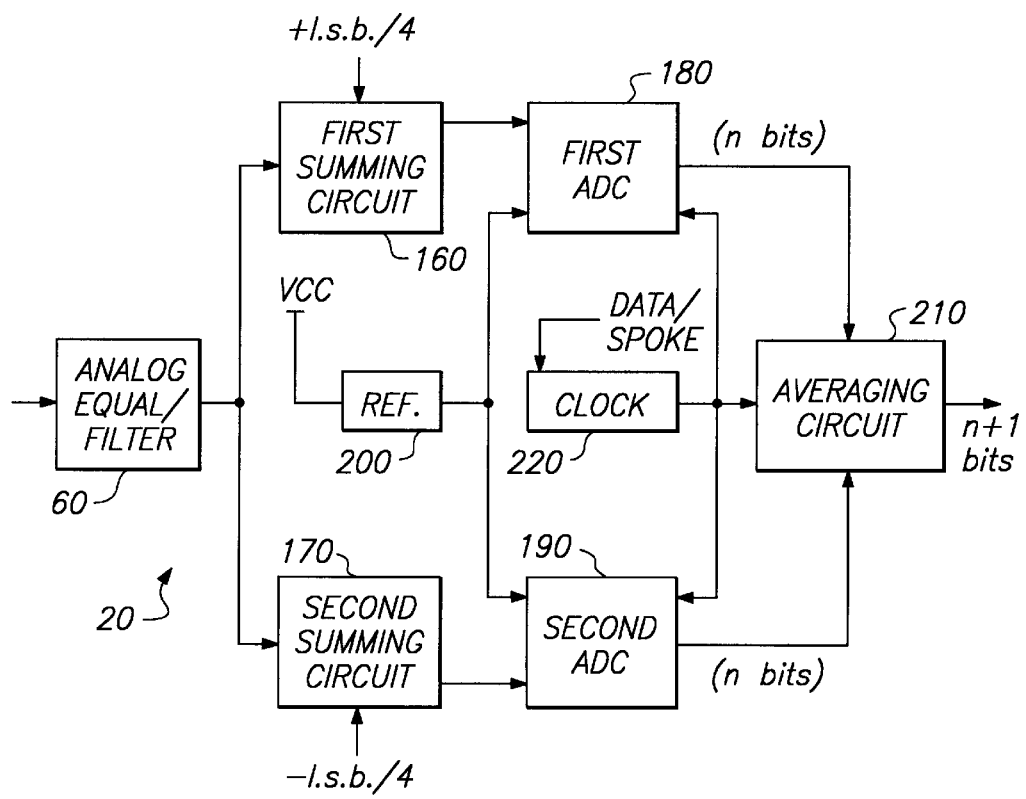
FIG. 7 is a block diagram of an analog-to-digital converter consistent with a first embodiment of the present invention.
Figure 8:
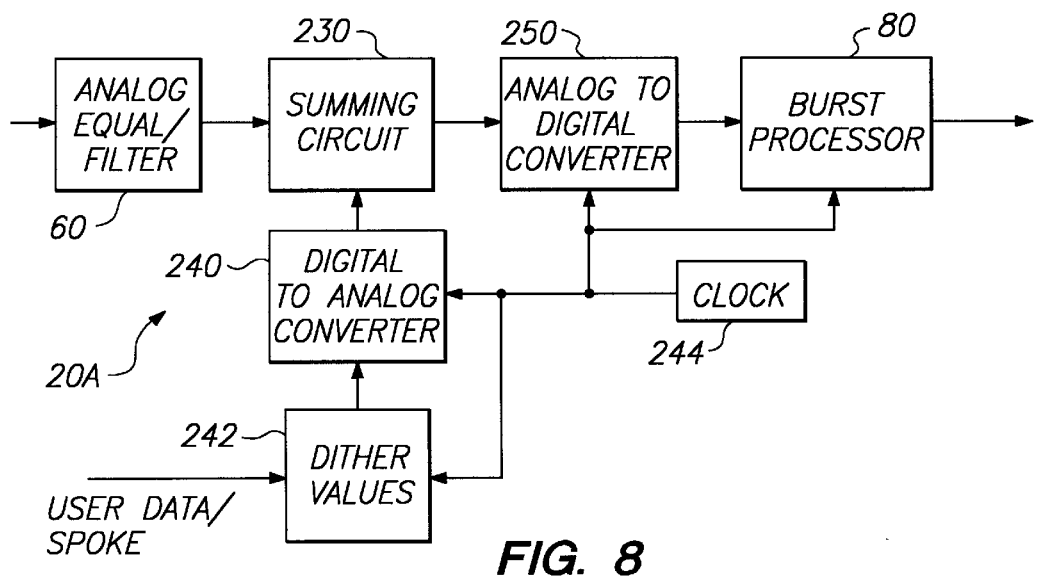
FIG. 8 is a block diagram of an analog-to-digital converter consistent with a second embodiment of the present invention.
Figure 9:
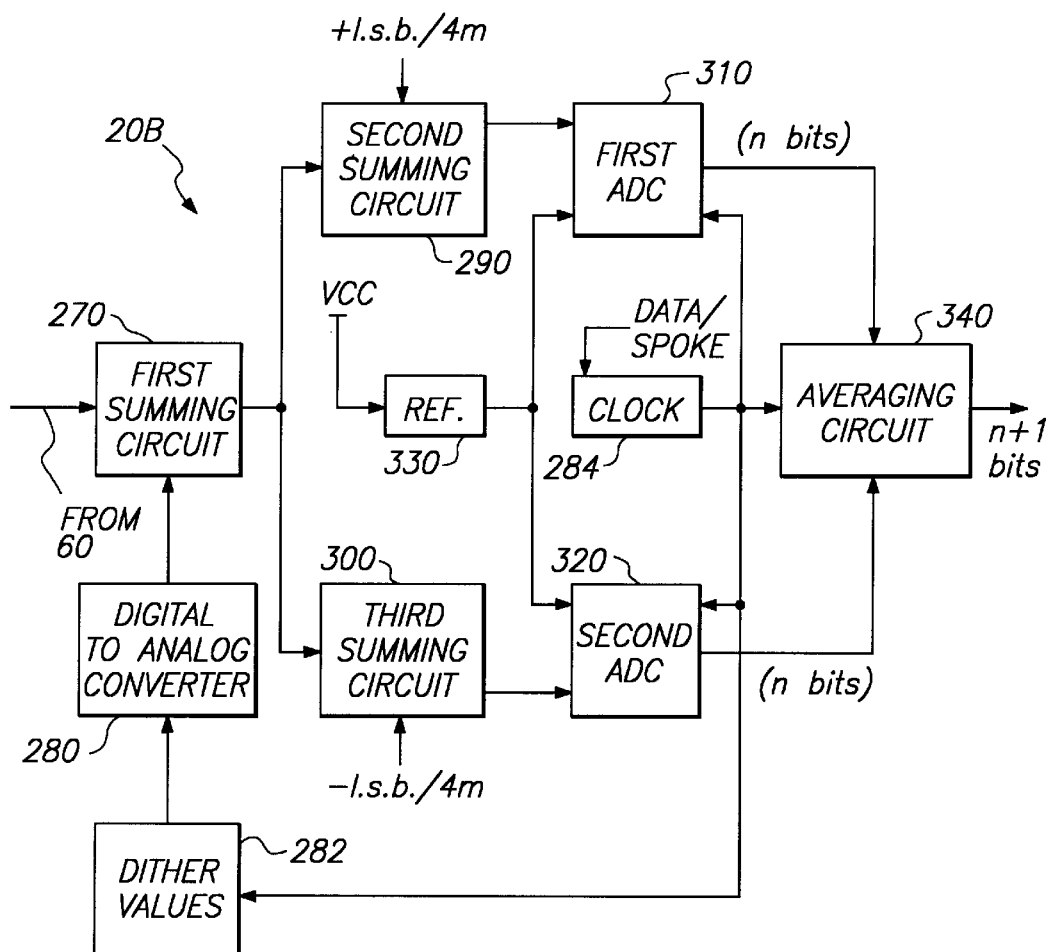
FIG. 9 is a block diagram of an analog-to-digital converter consistent with a third embodiment of the present invention.

FIG. 5 represents an outline model of the present invention, and FIGS. 7, 8 and 9 provide more structural details concerning practical implementations. In FIG. 5, a noiseless channel signal 11 representing an ideal playback at some relative amplitude of the servo burst 16A is combined with noise 13 at a combining function to provide a noisy burst signal. The noisy burst signal is combined with a dither signal 17 by a second summing function 19. The dither signal sequence is designed with several properties in mind. First, the dither signal should be a DC-free signal; if a non-DC free dither signal is used, an unwanted net offset bias is imposed on samples taken from the servo burst. Second, the dither signal has to be unbiased relative to a correlation function which is imposed by a signal correlation filter function 35 downstream of the analog-to-digital conversion of synchronous samples. For example, if four samples are synchronously drawn from each sine wave period of the burst 16A, two of the samples may be positive and approximately equal, followed by two samples which are negative and approximately equal. The correlation function simply removes the sign of the negative samples, so that absolute digital amplitude values may be accumulated by an accumulation function provided by accumulator 37 and sample delay 39 connected in a recursive arrangement via feedback path 41. Path 43 provides a burst amplitude output value at the end of the burst sampling and processing interval.

Following introduction of the dither signal 17, and providing that the channel has two analog-to-digital converters 25 and 33, positive and negative half least-significant-bit offsets 23 and 31 are added to the dithered burst signal respectively by summing functions 21 and 29, before the burst signals reach converters 25 and 33. The positive and negative half least-significant-bit offsets effectively provide synchronous samples with half least-significant-bit resolution. For example, if the converters 25 and 33 are six-bit converters, the offsets provide a seven bit result upon averaging over the burst window. The dithering signal increases the resolution from six bits to e.g. eight bits for the averaged burst signal by adding additional noise to the burst signal before sampling. This additional noise added to the sequence of bursts assures that any differential non-linearity within converters 25 and 33 do not preclude multiple comparators from being used during quantizing the samples taken from the burst signal. Thus, the effects of differential non-linearity are effectively moderated by use of multiple comparators and by averaging the filtered samples over the burst sampling interval. In this example, 32 samples are taken from eight sine wave periods of each burst, and the 32 samples are then averaged to produce an average burst amplitude value on path 43.

Figure 10:
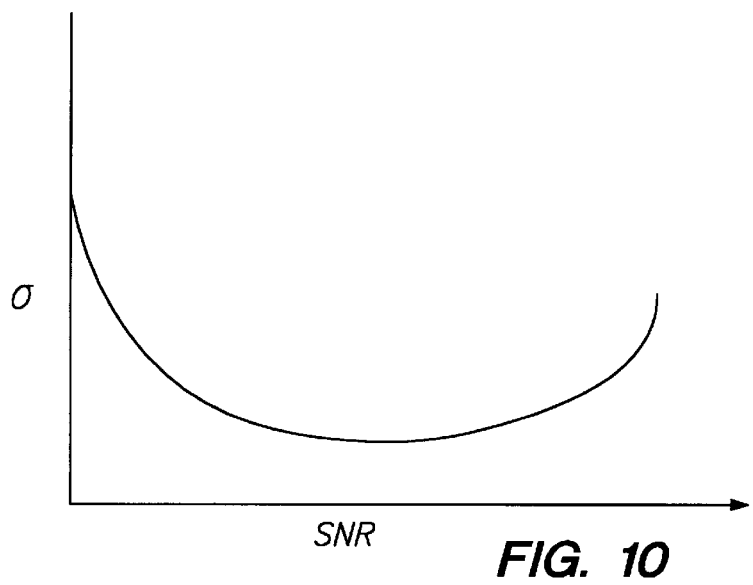
FIG. 10 is a graph of burst demodulation error (s) plotted as a function of signal-to-noise ratio within a synchronous sampling data detection channel.

FIG. 10 shows that, unexpectedly, as the channel signal-to-noise ratio improves (right hand direction, the burst demodulation error (s) improves for a while, but as the signal-to-noise ratio continues to improve, the burst demodulation error tends to increase, due to differential non-linearity and quantization error within the analog to digital converter. By employing the techniques described herein, this effect is overcome.

Figure 1:
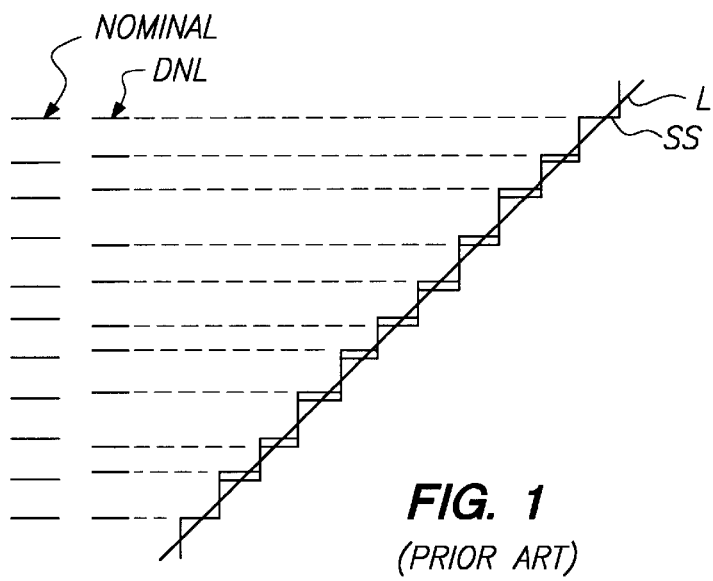
FIG. 1 is a graph illustrating differential non-linearity within an analog-to-digital converter.
Figure 2:
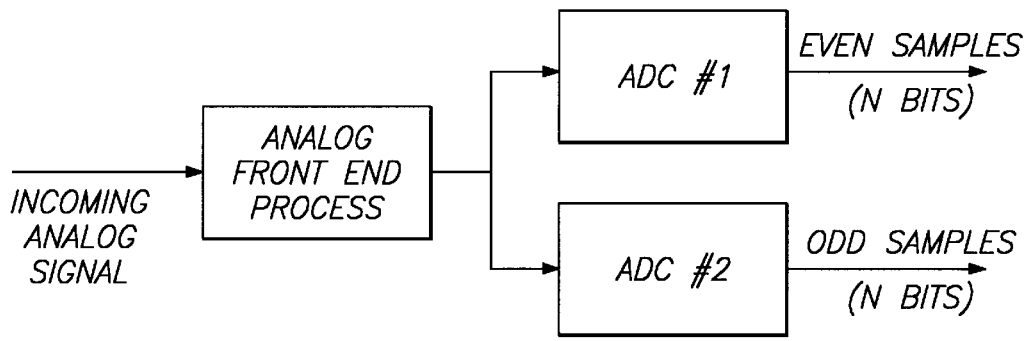
FIG. 2 is a block diagram of a conventional analog-to-digital converter.
Figure 2A:
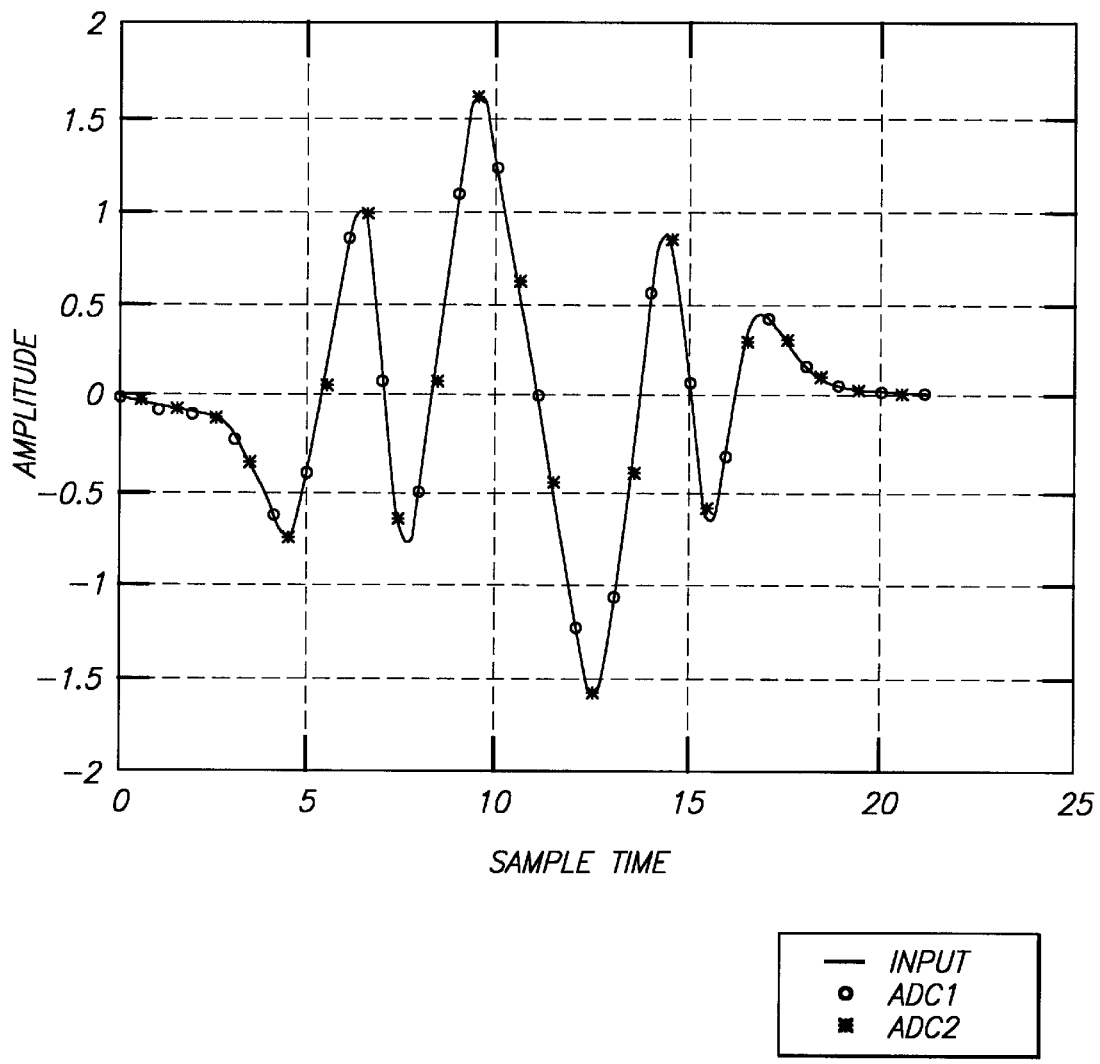
FIG. 2A is a graph showing exemplary user data quantization levels in the FIG. 2 dual analog-to-digital converter.

As shown in FIG. 6 an exemplary hard disk drive 10 includes the rotating data storage disk 12 coated with a suitable magnetic data storage medium. The data transducer 40 is positioned in close proximity to the data storage surface of the disk by e.g. a rotary voice coil actuator structure 18, and in conventional fashion includes e.g. a thin film inductive write element, and a magneto-resistive (MR) read element. As already explained in connection with FIGS. 3 and 4, the data storage surface of the disk 12 includes user data areas 14 which are separated by a series of radially extending, circumferentially spaced apart and embedded servo sectors or spokes 16. The spokes 16 are preferably, although not necessarily, encoded in accordance with the referenced copending U.S. patent. application Ser. No. 08/724,977. While only one data transducer structure 40 is shown in FIG. 1, it will be appreciated that multiple disk surfaces and heads are provided within commercially useful hard disk drives and that the drive 10 is by way of explanation and example of principles of the present invention, rather than as a commercial embodiment.

As shown in FIG. 6, a sampling data detection channel 22 employing an ADC 20 according to principles of the present invention comprises a preamplifier 30 for receiving analog information signals from a magnetic transducer 40 via a read channel data path including the preamplifier 30, a variable gain amplifier (VGA) 50, and equalizer/filter circuit 60 connected as shown in FIG. 6. The variable gain amplifier 50 may act independently, or in cooperation with a gain control loop 92, to receive the analog signals from the preamplifier 30 and adaptively adjust the gain of the signals. The gain-normalized signals are then filtered and equalized by the equalizer circuit 60. Thereafter, an ADC circuit 20 connected to the equalizer circuit 60 receives the gain-normalized and equalized analog signals and synchronously samples the analog signals to provide digitized samples. The present invention resides within improvements to the ADC circuit 20, so that during servo sampling intervals, the ADC circuit provides accurate digital head position error values, while during user data sampling the ADC circuit provides somewhat less accurate user data digital samples.

Following quantization within the ADC circuit 20, the digitized samples are selectively processed by the remainder of the sampling data detection electronics 10 which includes in the FIG. 6 example: an adaptive FIR filter 70 (e.g. PR4 target spectrum), target filter 110 (e.g. EPR4 target spectrum) and target detector 120, such as a Viterbi detector forming a user data digital channel, and a burst detector 80, chunk synchronization detection circuit 90, and servo fields decoder within a head position servo loop, and a gain control 92, a timing control 94, and error circuit 96 within gain and timing loops which operate during both user data sequence detection from the data areas 14 of the disk, and header/servo sequence detection from the spoke areas 16 of the disk. A servo control process 140 and a servo driver 150 provide driving signals to the actuator voice coil motor 18 thereby to move the head 40 from track to track during track seeking operations, and to maintain and correct head position during track following operations.

The invention set forth herein is directed to an improved common servo/user data path ADC 20 for use within the disk drive synchronous data detection channel 22 shown in FIGS. 5 and 6, for example. As shown in FIG. 7, a first embodiment of the improved ADC 20 comprises first and second analog summing circuits 160 and 170 connected in parallel to the equalizer 60 of the sampling data detection channel 22. The first and second analog summing circuits 160 and 170 may each follow a conventional implementation such as a pair of input resistors, each having a first end for receiving signals to be summed, and each having a second end connected to a first input of an operational amplifier (op-amp) with a feedback resistor also connected from an output to the first input. Each op-amp further includes a second input tied to ground such that the output of the op-amp will equal the sum of the signals connected to the input resistors.

In this embodiment 20 of FIG. 7, the summing circuits 160 and 170 sum respectively predetermined offset signals with the incoming equalized analog signal from the equalizer 60 of the channel 22. The first analog summing circuit 160 adds a first predetermined value to the analog signal to provide a first analog sum, and the second analog summing circuit 170 adds a second predetermined value to the signal to provide a second analog sum.

The predetermined values added by each of the first and second analog summing circuits 160 and 170 to the incoming equalized analog signal provide predetermined complementary amplitude offsets for the first and second analog sums. The amplitude offsets substantially contribute to minimizing quantization or rounding errors during subsequent signal processing operations. One preferred set of amplitude offsets includes offsets with equal magnitude and opposite signs. More preferably, the magnitudes of the offsets may be calculated by dividing the least significant bit of the analog-to-digital converter incoming voltage quantization resolution by four, e.g. Offset=$\pm^{l.s.b.}/4$.

The first analog summing circuit 160 output is further connected to an input of a first ADC 180 and the second analog summing circuit 170 output is further connected to an input of a second ADC 190. In addition, an analog reference level circuit 200 is connected to a voltage supply bus and provides reference quantization levels to the ADCs 180 and 190. The reference level circuit 200 is typically implemented as a resistive voltage divider network, or any functionally equivalent circuitry, having a plurality of taps that provide a like number of nominally equal step level analog reference voltages.

Both the first ADC 180 and the second ADC 190 are preferably comprised of an array of digital comparators for comparing the incoming analog signals received from the first and second analog summing circuits 160 and 170, respectively, with analog reference levels provided by the analog reference level circuit 200. This part of each digitizer circuit 180, 190, is conventional and well understood to those skilled in the art.

A digital averaging circuit 210 is connected to average digital samples from the first ADC 180 and the second ADC 190. The circuit 210 sums and averages the digitized samples provided by the first and second ADCs 180 and 190 over an averaging interval established by internal circuitry clocked by a common clock circuit 220. The digital summing and averaging circuitry may be constructed of an n-bit adder. Moreover, the first and second ADCs 180, 190 are clocked in synchronism by a common clock provided by the common clock circuit 220 and thereby maintain a synchronized sampling rate.

Figure 7A:
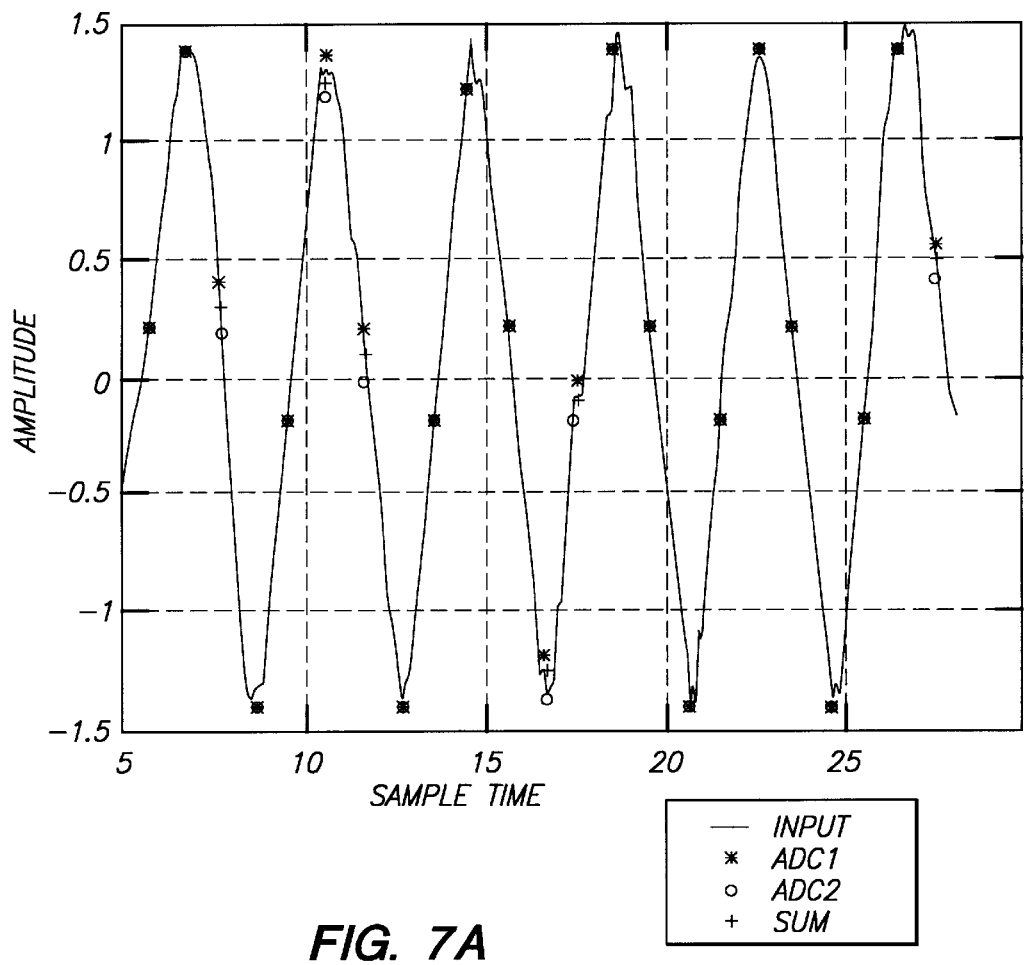
FIG. 7A is graph showing quantization of servo burst information by the FIG. 7 analog-to-digital converter.

In operation, the first ADC 180 quantizes the first analog sum from the first analog summing circuit 160 in reference to the analog reference signals from the reference level circuitry 200 to provide a sequence of first digitized samples. Similarly, a second ADC 190 quantizes the second analog sum from the second analog summing circuit 170 in reference to the analog reference signal from the reference level circuitry 200 to provide a sequence of second digitized samples. Moreover, the first 180 and second 190 ADCs are synchronized to a common clock 220 and thus have a common sampling rate during sampling of servo burst data as shown in FIG. 7A.

The digital summing and averaging circuit 210 calculates the sum and average of the first and second digitized samples to provide a digital average output. Since the first and second ADCs 180, 190, are synchronized to provide "n" bit digitized samples, the process of summing the samples by the summing/averaging circuit 210 provides an output with a higher resolution digitized sample, e.g., an "n+1" bit digitized sample.

By way of example, an ADC 20 as previously described may have a resolution value with a least significant bit (l.s.b.) equal to 1 and may receive an analog input signal having a peak-to-peak amplitude of 2.5 volts. Both the first 160 and second 170 summing circuits receive the 2.5 volts and then add a $\pm^{l.s.b.}/4$, or approximately 10 millivolt amplitude offset (preferably, each sum circuit receives an amplitude offset with opposite polarization, e.g., "+" or "−") . Thus, the first ADC 180 receives a 2.51 volts (2.5 v+0.01 v) analog signal from the first summing circuit 160. And similarly, the second ADC 190 receives a 2.49 volt (2.5 v−0.01 v) analog signal from the second summing circuit 170. Consequently, the first 180 and second 190 ADCs will round or quantize the analog signals received from the first 160 and second 170 summing circuits to provide digitized samples having peak to peak voltages of 2.51 volts and 2.49 volts respectively. Finally, the digital summing and averaging circuit 210 receives the 2.51 volt digitized sample from the first ADC 180 and the 2.49 volt digitized sample from the second ADC 190 and averages the samples to provide a 2.50-volt digitized average sample with increased bit resolution.

Most importantly, by adding amplitude offsets to the analog signals, converting the signals to digitized samples, and summing/averaging the digitized samples as explained hereinabove, an output is realized having minimal quantization errors and an increased bit resolution. This operation is most preferably carried out during servo spoke sampling intervals when the head 40 is passing over a prerecorded servo spoke 16 and reading i.e. head position burst values from a fine position field within the spoke. Increased resolution is thereupon advantageously utilized by the servo burst detector 80 in deriving a head position error value for insertion into the servo control process 140 shown in FIG. 1. During intervals when user data is being read from the data areas 14 of the disk 12, the ADC 20 is operating conventionally, e.g. synchronously at one half of the effective user data rate, with the ADC 180 quantifying even interleave samples, and the ADC 190 quantifying odd interleave samples, within a PR4ML channel target spectrum, for example. A control signal SERVO_SPOKE/DATA may be applied externally to the common clocking circuit 220 to switch the ADC 20 from servo spoke mode to user data mode, depending upon location of the head 40 as over user a data area 14 or a servo spoke 16.

In a second embodiment of the present invention, as shown in FIG. 8, an ADC function 20A providing improved servo burst resolution comprises an analog summing circuit 230 connected between the equalizer 60 of the data detection channel 22 and a conventional (e.g. 6 bit) flash analog-to-digital circuit (ADC) 250. The summing circuit 230 receives an analog signal input from the equalizer 60 and an analog dithering signal input from the output of a digital to analog converter (DAC) 240. The DAC circuit 240 includes conventional circuitry for converting a predetermined sequence of digital values into the analog dithering signal. Improved resolution within the ADC function 20A is realized by calculating or feeding a predetermined pattern of digital values, as from a table 242, to the DAC 240. The dither values are converted into the analog dithering signal by the DAC 240 and supplied to the analog summing circuit 230. The analog summing circuit 230 puts out a sum of the incoming equalized signal from equalizer 60 and the dithering signal from DAC 240 to the ADC 250. The ADC 250 then quantizes the incoming sum from summing circuit 230 into a sequence of synchronous digital samples at a sampling rate established by a common clocking control circuit 244. The analog summing circuit 230 and the ADC 250 may be constructed of circuitry similar to that shown in FIG. 8 and discussed in connection therewith. An output from the first ADC 250 is selectively connected to the digital burst processing circuit 80, which includes in this example an accumulation and averaging function for accumulating and averaging the samples over a predetermined sampling interval established e.g. by the clock circuit 244.

A presently preferred dithering sequence is:

lsb/8 [3333 1111 -1-1-1-1 -3-3-3-3]

In general, adjacent dithering values are spaced in accordance with Isb/m increments. For example, if m=4, the adjacent dithering values would be lsb/4 apart.

During operation of the ADC 20a shown in FIG. 8, the analog summing circuit 230 receives from the equalizer 60 the first analog signal read from a spoke 16 by the magnetic transducer 40. Additionally, the analog summing circuit 230 receives an analog dithering signal from the DAC circuit 240 in synchronism with ADC 250 as established by clock control circuit 244. The analog dithering signal received from the DAC circuit 240 and the analog signal received from the read channel data path are summed by the analog summing circuit 230 to provide a summed analog signal, which is subsequently quantized by the first ADC 250 and put out to the burst detector 80 for the averaging function. The analog signal sum including the dither component will result in quantization by the first ADC 250 with increased least significant bit (l.s.b.) resolution, similar to the improved resolution previously described in conjunction with the ADC 20 of FIG. 7 The improved resolution n-bit digitized samples, provided by the ADC 250, are subsequently averaged by the burst processor 80 and result in improved resolution digital servo burst samples.

More precisely, during the reading of servo spoke data from a spoke 16, the analog summing circuit 230 adds the predetermined analog dithering signal to the gain-normalized and equalized analog signal received from the magnetic transducer 40 (via the analog read channel data path). The analog dithering signal provided by the DAC circuit 240 provides an offset to the analog signal for providing an analog summed signal. The offset values added to the analog signal result in quantization values, which are biased by the dithering component, to unit values above and below the nominal level of the unbiased equalized analog signal. Over an averaging interval within the burst processor 80, the samples are averaged and result in a burst amplitude value having an increased l.s.b. resolution. The increased bit resolution is consistent with the equation: "$\log_2 m$", where "m" is the number of different predetermined dithering values provided to the DAC circuit 240, which are subsequently converted to the analog dithering signal by the DAC circuit 240, and then added to the analog signal by the analog summing circuit 230 to provide the summed analog signal synchronously quantized by ADC 250.

The process of adding the analog dithering signal to the analog signal received from the disk data path is synchronized to the sampling rate of the first ADC 250 by the clock control circuit 244. Thus, the dithering values added to the analog signal have an effect of conditioning the analog signal such that subsequent sampling by the ADC 250 will occur with minimal errors. Moreover, the analog summed signal received by the ADC 250 will be more accurately sampled and averaged due to an increase in the effective resolution of the least significant bit (l.s.b.) burst value after averaging. A predetermined number of dithering values provided to the DAC circuit 240 will produce a predetermined number of analog dithering signals at the output of the DAC circuit 240. In one preferred implementation, four dithering values, i.e., m=4, may be used to increase the l.s.b. resolution of the ADC 250 by two bits, i.e., log 4=2 bits. The two-bit sampling point resolution improvement of ADC 250 provides an increase in the resolution of the digital sample realized at the output of the burst processor 80.

While reading the user data areas 14, however, the dithering value provided to the DAC circuit 240 is simply set to zero, since a higher resolution demodulated digital data sample is not required for the digital user data processing elements 110 and 120 of the channel 22. Thus, during user data mode, the analog summing circuit essentially passes the analog signal derived from the analog data path directly to the first ADC 250 without adding an analog dithering signal. Hence, an ADC function 20A with a common data path for demodulating user data as well as a high resolution servo spoke information mode for demodulating servo spoke data is realized.

In a third embodiment of the present invention as shown in FIG. 9, the elements, circuitry, and functionality of the embodiments shown in FIG. 7 and FIG. 8 are effectively combined. The third embodiment 20B of the ADC incorporating principles of the present invention comprises a first analog summing circuit 270 that receives an analog signal from a source, such as the equalizer 60 of the sampling data detection channel 22 of disk drive 10, and an analog dithering signal from a DAC circuit 280. The DAC circuit 280 produces a predetermined number of analog dithering signals based on a predetermined number dithering values provided thereto from e.g. a table register array 282. In this manner, "m" different dithering offset values may be introduced to the DAC circuit 280 to produce a like number of analog dithering signals which are subsequently summed with the channel analog signal by the first analog summing circuit 270 to provide a first summed analog signal. Additionally, a subsequent analog-to-digital conversion operation of the first summed analog signal realizes minimal quantization errors and a "log m" increased bit resolution as per the ADC 20a set forth in FIG. 4.

Second and third analog summing circuits 290 and 300 have inputs individually connected to the first analog summing circuit 270. Both the second and third analog summing circuits receive the first summed analog signal from the first analog summing circuit 270. The second analog summing circuit 290 adds a first predetermined offset value to the first analog summed signal to provide a second analog sum, and the third analog summing circuit 300 adds a second predetermined offset value to the first analog summed signal to provide a third analog sum. As with the FIG. 7 embodiment 20, preferred first and second offset values are $\pm l.s.b./4m$ where m is the number of dithering levels, usually 2 or 4.

A first ADC 310 is connected to the second analog summing circuit 290 as well as to an analog reference level circuit 330. The first ADC 310 transforms the second analog sum received from the second summing circuit 290 and an analog reference signal received from the analog reference level circuitry 330 to a sequence of first digitized samples.

Similarly, a second ADC 320 is connected to the third analog summing circuit 300 as well as to the analog reference level circuit 330. The second ADC 320 transforms the third analog sum received from the third summing circuit 300 and the analog reference signal received from the analog front end circuit 330 to a sequence of second digitized samples.

Thereafter, a digital summing and averaging circuit 340, such as an n-bit adder, averages the sequences of first and second digitized samples respectively from the ADCs 310 and 320 over an averaging interval established by a common clock control circuit 284 and provides an output representative of the calculation. The clock 284 synchronizes quantization operations of the ADCs 310 and 320 with the averaging function provided by the circuit 340 and with the dithering function provided by DAC 280 via table 282. Those skilled in the art will appreciate that the FIG. 9 embodiment 20B effectively implements the FIG. 5 model and results in a superior servo burst synchronous demodulator for synchronously demodulating and providing a digital burst amplitude value in which unwanted noise and differential non-linearity are reduced.

The above described embodiments of the present invention have many advantages, including an improved synchronous data detection channel ADC and conversion method which can be adapted to provide a higher bit resolution with minimal quantization errors for fine head position servo sampling during data tracking operations in a disk drive. While a magnetic hard disk drive is described, the principles of the present invention may find useful application to other mass storage devices and the like.

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. An improved analog-to-digital converter circuit for a sampling data detection channel of a disk drive, the disk drive including a rotating disk having data track areas divided by spoke areas, the improved analog-to-digital converter circuit for synchronously sampling user data in the data track areas at a first quantization resolution and for synchronously sampling a servo burst field from at least one of the spoke areas at a second quantization resolution effectively greater than said first quantization resolution and comprising:

an input for receiving an analog signal to be quantized from analog circuitry of the disk drive;

offset signal producing means for providing a predetermined analog offset signal;

combining means including first and second analog summing circuits for combining the analog signal with the offset signal to provide composite signals during a spoke servo sampling interval, the first analog circuit for adding a first predetermined analog offset value to the analog signal to provide a first composite signal, and the second analog circuit for adding a second predetermined analog offset value to the analog signal to provide a second composite signal;

analog-to-digital conversion means including a first analog-to-digital converter connected to sample the first composite signal, and a second analog-to-digital converter connected to sample the second composite signal the first and the second analog-to-digital converters for sampling the composite signals during the servo spoke sampling interval, and for sampling the analog signal during a user data sampling interval, for producing sequences of spoke servo samples and user data samples; and digital averaging means connected to average the spoke servo samples over a predetermined averaging interval to provide servo spoke average samples having increased bit resolution.

2. The improved analog-to-digital converter circuit of claim 1 wherein preferred first and second predetermined analog offset values are calculated by the equation, Offset= $\pm l.s.b./4$, where l.s.b. is the least significant bit resolution of the first and second analog-to-digital converters.

3. The improved analog-to-digital converter circuit of claim 1 wherein the first and the second digitized samples are n-bits in length, and where said digitized output is (n+1)-bits in length.

4. The improved analog-to-digital converter circuit of claim 1 wherein the first analog-to-digital converter and the second analog-to-digital converter are synchronized by a common digital clock.

5. The improved analog-to-digital converter circuit of claim 1 wherein said servo spoke average samples are provided to a servo position control of the disk drive for minimizing head position estimation errors.

6. The improved analog-to-digital converter circuit of claim 1 wherein the offset signal producing means comprises a dither signal source for generating an analog dithering signal.

7. The improved analog-to-digital converter circuit of 6 wherein the dither signal source includes a digital to analog converter for converting predetermined digital dithering values into the analog dithering signal.

8. The improved analog-to-digital converter circuit of claim 7 wherein the predetermined digital dithering values are provided from a table to the digital to analog converter.

9. The improved analog-to-digital converter circuit of claim 8 wherein the average spoke servo samples have an increased bit resolution calculated by an equator "$\log_2 m$", where "m" represents the number of the predetermined digital dithering values.

10. The improved analog-to-digital converter circuit of claim 9 wherein a preferred number of predetermined digital dithering values is four.

11. The improved analog-to-digital converter circuit of claim 1 wherein the digital averaging means comprises an accumulator for summing and averaging the spoke servo samples.

12. The improved analog-to-digital converter circuit of claim 1 wherein the first and second analog-to-digital converters asynchronously sample the composite signals during the servo spoke sampling interval, and sample the analog signal during a user data sampling interval in synchronism with a nominal data rate and phase, for producing asynchronous sequences of spoke servo samples and synchronous sequences of user data samples.

13. The improved analog-to-digital converter circuit of claim 1, wherein the first and second analog-to-digital converters synchronously sample the composite signals during the servo spoke sampling interval, and synchronously sample the analog signal during a user data sampling interval, for producing synchronous sequences of spoke servo samples and synchronous sequences of user data samples.

14. An improved analog-to-digital converter circuit for a sampling data detection channel of a disk drive, the improved analog-to-digital converter circuit comprising:
   a first analog summing circuit for receiving an analog signal from a first source, the first analog summing circuit receiving an analog dithering signal from a second source, wherein the first analog summing circuit sums the analog signal and the analog dithering signal to provide a first summed analog signal;
   second and third analog summing circuits connected to the first summing circuit, the second analog summing circuit for adding a first predetermined offset value to the first summed analog signal to provide a second analog sum, the third analog summing circuit for adding a second predetermined offset value to the first summed analog signal to provide a third analog sum;
   a first analog-to-digital converter connected to the second summing circuit and analog front end circuit for transforming the second analog sum to a sequence of first digitized samples;
   a second analog-to-digital converter connected to the third summing circuit and analog front end circuit for transforming the third sum to a sequence of second digitized samples; and
   a digital summing and averaging circuit for summing and averaging the first and the second digitized samples to provide a digitized output.

15. The improved analog-to-digital converter circuit of claim 14 wherein the first source is an equalizer circuit connected to the sampling data detection and estimation channel of the disk drive.

16. The improved analog-to-digital converter circuit of claim 15 wherein the second source is an analog dithering signal generated by a digital to analog converter from a predetermined sequence of digital dithering values.

17. The improved analog-to-digital converter circuit of claim 16 wherein the first and the second digitized samples are "n" bits in length, and where said digitized output is "n+1" bits in length.

18. The improved analog-to-digital converter circuit of claim 16 wherein a predetermined number digital dithering values are provided to the digital to analog converter to produce the analog dithering signal.

19. The improved analog-to-digital converter circuit of claim 18 wherein the analog dithering signal is generated from "m" digital dithering values and is summed with the analog signal such that a "$\log_2 m$" increased bit resolution is realized following analog-to-digital conversion of the first analog signal, where "m" is the number of digital dithering values used by the digital to analog converter to produce the analog dithering signal.

20. The improved analog-to-digital converter circuit of claim 14 wherein the first analog-to-digital converter is synchronized to the second analog-to-digital converter by a common digital clock to provide a high resolution synchronized digital output.

21. The improved analog-to-digital converter circuit of claim 14 wherein a common data path of the disk drive is used for data detection and servo head position error estimation.

22. The improved analog-to-digital converter circuit of claim 21 wherein said digitized output comprising servo head position error estimation average samples is connected to a servo position control system of the disk drive for minimizing servo position estimation errors.

23. The improved analog-to-digital converter circuit of claim 14 wherein preferred first and second predetermined offset values are provided in accordance with the equation, offset $=\pm^{l.s.b.}/_4$.

24. An improved analog-to-digital converter circuit for a partial-response, maximum likelihood synchronous sampling data detection channel of a hard disk drive, the hard disk drive including a rotating rigid disk having data track areas divided by spoke areas, the improved analog-to-digital converter circuit for synchronously sampling user data in the data track areas at a first quantization resolution and for synchronously sampling a servo burst field from at least one of the spoke areas at a second quantization resolution effectively greater than said first quantization resolution and comprising:
   an input for receiving an analog signal to be quantized from an analog read data channel of the disk drive;
   a source providing an analog dither signal,
   a first summing circuit for summing the analog signal with the analog digital values to produce a first sum at an output,
   a first path connected to the output and including a second summing circuit and a first analog-to-digital converter for generating first digital samples at the first quantization resolution, the second summing circuit for combining the first sum with a first predetermined offset value,
   a second path connected to the output and including a third summing circuit and a second analog-to-digital converter for generating second digital samples at the first quantization resolution, the third summing circuit for combining the first sum with a second predetermined offset value different from said first predetermined offset value, and
   digital averaging means connected to average the first and second digital samples over a predetermined averaging interval to provide average samples having the second quantization resolution.

25. The improved analog-to-digital converter circuit of claim 24 wherein the source providing an analog dither signals includes a dither value source providing digital dither values, and a digital-to-analog converter for converting the digital dither values into the analog dither signal.

26. The improved analog-to-digital converter circuit of claim 25 wherein the dither value source comprises a look up table.

27. The improved analog-to-digital converter circuit of claim 25 wherein the analog dithering signal is generated from "m" digital dithering values and is summed with the analog signal such that a "$\log_2 m$" increased bit resolution is realized at the digital averaging means, where "m" is the number of digital dithering values used by the digital to analog converter to produce the analog dithering signal.

28. The improved analog-to-digital converter circuit of claim 24 wherein the first predetermined offset value is $+^{l.s.b.}/_{4m}$, and wherein the second predetermined offset value is $-^{l.s.b.}/_{4m}$ where m comprises an integer lying in a range from 1 to 8.

29. The improved analog-to-digital converter circuit of claim 24 wherein the digital averaging means includes means for removing the signs of the first and second digital samples, to provide said average samples as absolute values.

30. The improved analog-to-digital converter circuit of claim 24 wherein a plurality of servo burst fields within said spoke are synchronously sampled.

31. The improved analog-to-digital converter circuit of claim 30 wherein the plurality of servo burst fields within said spoke are arranged in a predetermined circumferentially sequential and radially offset pattern.

* * * * *